US012590989B2

(12) United States Patent
Ooi

(10) Patent No.: US 12,590,989 B2
(45) Date of Patent: Mar. 31, 2026

(54) TEST PIN STRUCTURE

(71) Applicant: Cheong Kheng Ooi, Penang (MY)

(72) Inventor: Cheong Kheng Ooi, Penang (MY)

(*) Notice: Subject to any disclaimer, the term of this patent is extended or adjusted under 35 U.S.C. 154(b) by 204 days.

(21) Appl. No.: 18/669,593

(22) Filed: May 21, 2024

(65) Prior Publication Data

US 2024/0393366 A1    Nov. 28, 2024

(30) Foreign Application Priority Data

May 22, 2023    (CN) .......................... 202321234600.5

(51) Int. Cl.
*G01R 1/067*        (2006.01)
*G01R 31/28*        (2006.01)

(52) U.S. Cl.
CPC ..... *G01R 1/06716* (2013.01); *G01R 31/2886*
(2013.01)

(58) Field of Classification Search
CPC ............ G01R 1/06716; G01R 31/2886; G01R
1/06738; G01R 1/06733; G01R 1/0675;
G01R 1/06727; G01R 1/06744
See application file for complete search history.

(56) References Cited

U.S. PATENT DOCUMENTS

| | | | | |
|---|---|---|---|---|
| 6,504,223 B1 * | 1/2003 | Zhou | ................. | H01R 13/2428 |
| | | | | 257/E23.021 |
| 7,254,889 B1 * | 8/2007 | Cherian | ............ | H01L 23/49811 |
| | | | | 324/755.05 |
| 2017/0219624 A1 * | 8/2017 | Foong | ................ | G01R 31/2886 |

FOREIGN PATENT DOCUMENTS

KR        20120044960 A  *  5/2012  ........... G01R 1/0416

OTHER PUBLICATIONS

Machine translation of KR-20120044960-A (Year: 2012).*

* cited by examiner

*Primary Examiner* — G. M. A Hyder
(74) *Attorney, Agent, or Firm* — HSML P.C.

(57)    ABSTRACT

This invention discloses a test pin structure comprising a main body end, with a first elastic pin and a second elastic pin extending from the main body end on the same side, wherein the first elastic pin extends obliquely upward from one end of the main body end; the other end of the first elastic pin is connected to a counteracting pin portion; and a needle tip is vertically positioned at the other end of the counteracting pin portion; a pin is vertically oriented downward at the other end of the second elastic pin; this invention reduces the sliding distance of the needle tip by incorporating a counteracting pin portion that moves in the opposite direction to the first elastic pin, and the pressure return force generated by the contact forces of the first elastic pin and the counteracting pin portion drives the needle tip to be inserted into the chip. This way, when the pressure return force drives the needle tip to be inserted into the chip, it avoids scratching the chip surface, and the magnitude of the pressure return force only affects the depth of insertion into the chip, without affecting the contact surface for testing; the left and right sliding of the needle tip is used to clean the contact surface of the needle tip.

9 Claims, 4 Drawing Sheets

TEST PIN STRUCTURE

CROSS-REFERENCE

This application claims the benefit of priority from Chinese Patent Application No. 2023212346005, filed on May 22, 2023, the entire contents of which are incorporated herein by reference.

TECHNICAL FIELD OF THE INVENTION

The present invention belongs to the field of chip testing technology, specifically relating to a test pin structure.

BACKGROUND OF THE INVENTION

In recent years, the new technology represented by the information technology promotes the rapid growth of the electronic industry, and also greatly promotes the rapid development of the testing and measuring instrument and equipment, such as the chip testing device. At present, the chip needs to be tested after the manufacturing is completed, and the wiring terminal of the chip is usually in contact with the PCB board by using the testing pin.

As shown in FIG. 1, the existing test pin structure includes a main body end 1, a first pin 10 and a second pin 11 extend outward from two ends of the main body end 1 respectively, the other end of the first pin is connected with a needle tip 6 disposed vertically upward, and the other end of the second pin 11 is connected with a vertically downward pin 4.

During testing, the chip is pressed to the needle tip 6 and continues to be pressed down, the pressing force is pushed upward from the bottom, when the pressing force is pushed upwards, the needle tip 6 slides sideways, that is, the needle tip moves from the P1 point to the P2 point, the result can cause the scratch distance of the needle tip 6 to the chip from the P1 point to the P2 point, and the elongated scratch can scratch the electroplating material of the chip in the socket to cause unnecessary test failure.

Furthermore, the tip of the needle also needs to control the pressing force to a certain pressure, which would otherwise result in poor contact between the needle tip and the chip, resulting in failure of the chip test, but the larger pressing force will cause larger and deeper scratches on the chip, making it more likely to remove the plating material onto the socket.

SUMMARY OF THE INVENTION

The objective of this invention is to overcome the shortcomings of existing technology and provide a test pin structure that, during testing, does not cause scratches on the chip when the chip is subjected to pressing force to press the needle tip of the pin, resulting in good testing performance and long lifespan.

In order to achieve the above objective, the technical solution adopted in this invention is as follows: a test pin structure, comprising:

A main body end, two ends of the main body end respectively extending outwards on the same side to form a first elastic pin and a second elastic pin, wherein the first elastic pin obliquely extends upward from one end of the main body end;

Counteracting pin portion, the other end of the first elastic pin is connected to the counteracting pin portion;

Needle tip, which is vertically disposed at the other end of the counteracting pin portion;

Pin, which is vertically oriented and facing downward, located at the other end of the second elastic pin;

When the needle tip is subjected to pressing force from the chip, the contact force on the first elastic pin and the counteracting pin portion drives the needle tip to slide in opposite directions, thereby reducing the sliding distance of the needle tip, and then the resulting counter pressure, generated by the contact force on the first elastic pin and the counteracting pin portion allows the needle tip to be inserted into the chip.

Further, the included angle between the first elastic pin and the main body end is between 90° and 125°.

Further, the counteracting pin portion comprises a bending section connected to the first elastic pin, and the bending direction of the bending section points toward the main body end; and the other end of the bending section is connected to a counteracting pin, with the counteracting pin's other end pointing toward the main body end.

Further, the counteracting pin portion is a circular pin, and the arc opening of the circular pin faces one side of the main body end.

Further, the bending angle of the bending section is between 35°~70°.

Further, the reduction in sliding distance of the needle tip is approximately 0 to 0.05 mm in both left and right directions.

Further, when the needle tip is subjected to pressing force, the contact force generated by the first elastic pin is driven to be more or less the same as the contact force generated by driving the counteracting pin.

Further, when the needle tip is subjected to pressing force, the contact force generated by the first elastic pin is smaller than the contact force generated by driving the counteracting pin.

Further, when the needle tip is subjected to pressing force, the contact force generated by the first elastic pin is greater than the contact force generated by driving the counteracting pin.

Due to the application of the aforementioned technical solutions, this invention has the following advantages compared to existing technology:

According to the test pin structure of the present invention, by additionally arranging the counteracting pin portion opposite to the sliding direction of the needle tip driven by the first elastic pin, the sliding distance of the needle tip on the chip can be reduced, and the resulting counter pressure generated by the contact force generated by both the first elastic pin and the counteracting pin portion drives the needle tip to be inserted into the chip, such that the magnitude of the counter pressure only affects the depth of insertion into the chip, which does not cause a poor contact surface of the chip to affect the result of the test, thereby improving the lifespan of the test pin.

In addition, the needle tip can slide left and right when subjected to pressing force, and the left and right sliding motion of the needle tip can be utilized for cleaning the contact surface of the needle tip, so that the needle tip does not easily accumulate the detached electroplating material.

BRIEF DESCRIPTION OF THE DRAWINGS

The technical solutions of the present invention will be further described below with reference to the accompanying drawings.

Figure 1:
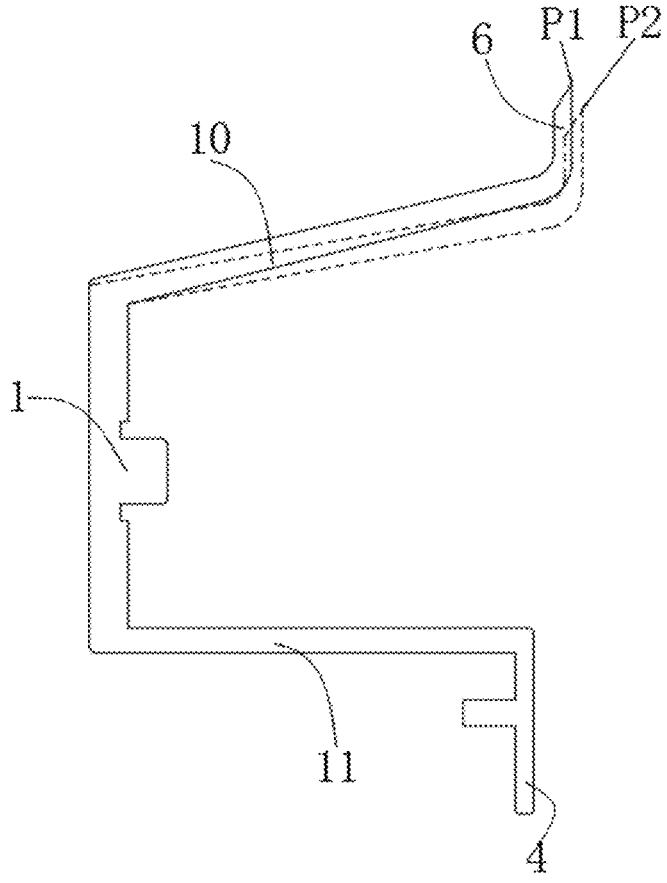
FIG. 1 is a 1 is a schematic structural diagram of a test pin structure in the prior arts.

The figures: the main body end 1, the first elastic pin 2, the second elastic pin 3, the pin 4, the counteracting pin portion 5, the needle tip 6, the first pin 10, the second pin 11, the bending section 50, the counteracting pin 51, and the circular pin 52.

DETAILED DESCRIPTION OF THE EMBODIMENTS

In order to enable a person skilled in the art better understand the solutions of this application, the technical solutions in the embodiments of this application will be clearly and completely described below with reference to the accompanying drawings in the embodiments of this application. It should be noted that the described embodiment is only a part of the embodiments disclosed in this application, and not the entirety of the embodiments. All other embodiments obtained by a person of ordinary skill in the art based on the embodiments of the present application without exercising inventive efforts shall fall within the protection scope of the present application.

The present invention provides a test pin structure to solve the problem in the prior arts where, during testing, the chip presses the needle tip 6 down, the pressing force or return force causes the needle tip 6 to slide on the chip by a certain distance, thereby generating scratches on the chip, and the scratching can cause the electroplating material of the chip to come off on the socket, leading to unnecessary test failures.

For ease of understanding, the specific processes in the embodiments of this application are described below, please refer to FIG. 2, which illustrates a test pin structure, comprises a main body end 1, a first elastic pin 2, a second elastic pin 3, a pin 4, a counteracting pin 5, and a needle tip 6; two ends of the main body end 1 respectively extend to the right to form a first elastic pin 2 and a second elastic pin 3, wherein the first elastic pin 2 extends obliquely upward; and the pin 4 is vertically downward disposed at the other end of the second elastic pin 3.

One end of the counteracting pin portion 5 is connected to the other end of the first elastic pin 2, and the needle tip 6 is disposed at the other end of the counteracting pin portion 5.

During testing, when the needle tip 6 is pressed down by the chip, the corresponding contact forces are generated by the first elastic pin 2 and the counteracting pin 5, the contact forces of said first elastic pin 2 and the counteracting pin 5 respectively drive the needle tip 6 to slide to the right and left. This way, the contact forces from both pins cancel out or offset the sliding distance of the needle tip 6, reducing its sliding distance on the chip, and the pressure return force generated by the contact force of the first elastic pin 2 and the counteracting pin portion 5 drives the needle tip 6 to be inserted into the chip, so that the pressure return force only affects the depth of the needle tip inserted into the chip, and does not cause poor contact on the chip surface which may affect the test result, thus improving the lifespan of the test pin structure.

In addition, the needle tip 6 can slide left and right when the needle tip 6 is pressed, and the left and right sliding motion of the needle tip can be used to clean the contact surface of the needle tip, so that the needle tip does not easily accumulate or occupy the fallen or detached electroplating material, wherein the electroplating material generally refers to tin, nickel, or other materials.

In summary, the present test pin structure achieves the reduction of sliding distance of the needle tip 6 on the chip by incorporating a counteracting pin portion 5 between the needle tip 6 and the first elastic pin 2, this allows the needle tip 6 to be directly inserted into the chip from the pressing force or return force after the sliding distance of the needle tip 6 on the chip, without causing scratches to the chip, the overall structure is simple, and the manufacturing cost is low.

In this embodiment, the included angle between the first elastic pin 2 and the main body end 1 is 90-125 degrees, so that the first elastic pin 2 is inclined to the upper right portion of the main body end 1, so that when the needle tip 6 is subjected to pressing force, the contact force of the first elastic pin 2 drives the needle tip 6 to slide to the right side, and different included angles correspond to different contact forces of the first elastic pin 2, to accommodate different testing pin structures.

Figure 2:
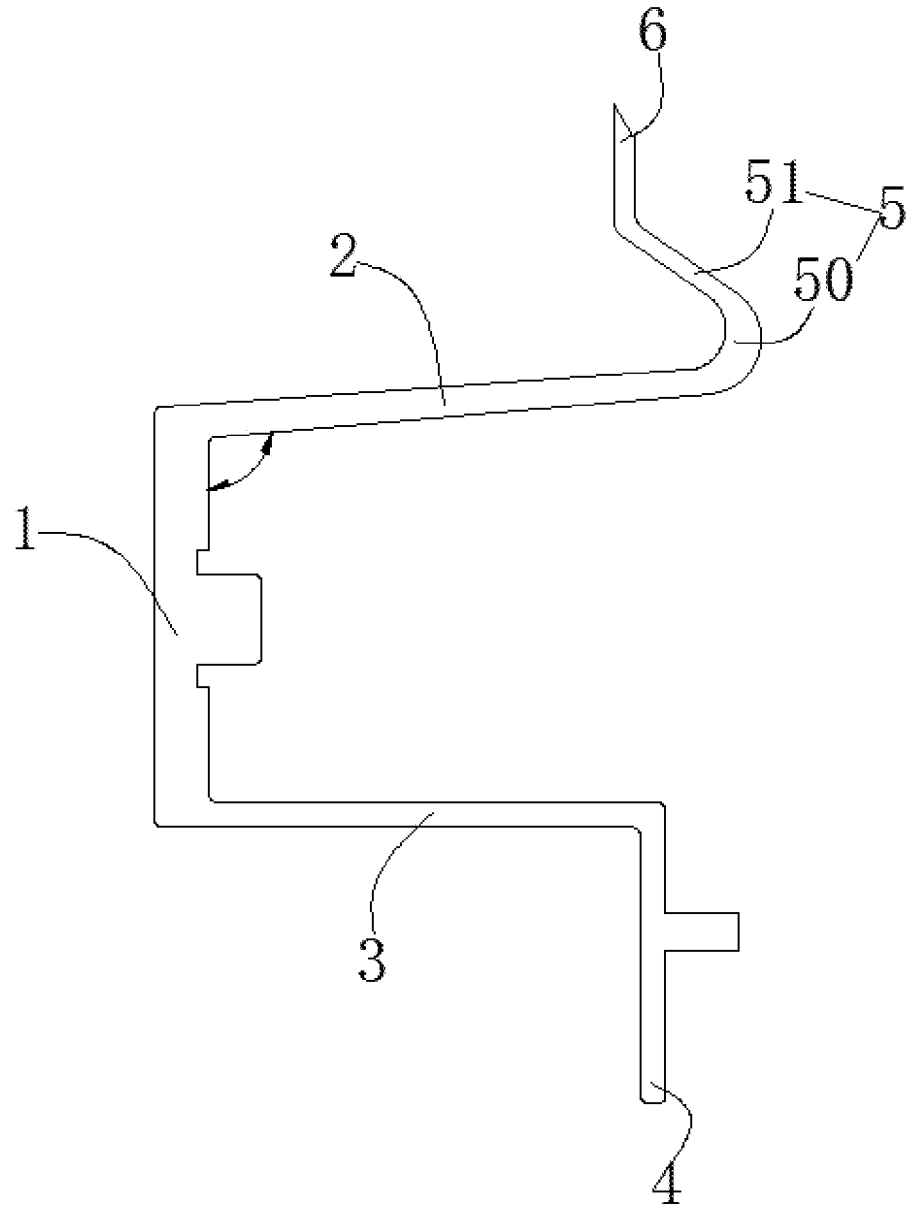
FIG. 2 is a schematic structural diagram of a test pin structure according to one embodiment of the present disclosure.

In this embodiment, the counteracting pin portion 5 comprising a bending section 50 connected to the first elastic pin 2, the arc opening of the bending section 50 points to the main body end 1, the other end of the bending section 50 is connected to a counteracting pin 51, and the other end of the counteracting pin 51 points to the main body end 1; it can be seen from FIG. 2 that the counteracting pin 51 is inclined to the upper left along the bending section 50, and the needle tip 6 is disposed vertically above the counteracting pin 51.

In this way, when the needle tip 6 is pressed downward, the contact force of the first elastic pin 2 drives the needle tip 6 to slide to the right, the counteracting pin 51 then drives the needle tip 6 to slide to the left, so that the sliding distance of the needle tip 6 on the chip can be reduced, ensuring that no scratches are made on the chip.

In this embodiment, the bending angle of the bending section 50 is between 35-70°, the magnitude of the bending angle also determines the magnitude of the contact force of the counteracting pin 51, and it can be designed correspondingly according to actual and specific requirements.

In this embodiment, the reduced sliding distance of the needle tip 6 is between 0-0.05 mm in a lateral motion or left-right sliding manner, and specifically, under the driving of the first elastic pin 2 and the counteracting pin 51, the needle tip 6 may remain stationary, or may slide to the left or the right, and the sliding value is ranged between 0 and 0.05 mm.

In this embodiment, the contact force generated by driving the first elastic pin 2 when the needle tip 6 is pressed down is more or less the same as the contact force generated by driving the counteracting pin 51, so that the needle tip 6 is directly inserted into the chip, and does not cause scratches on the chip.

Figure 3:
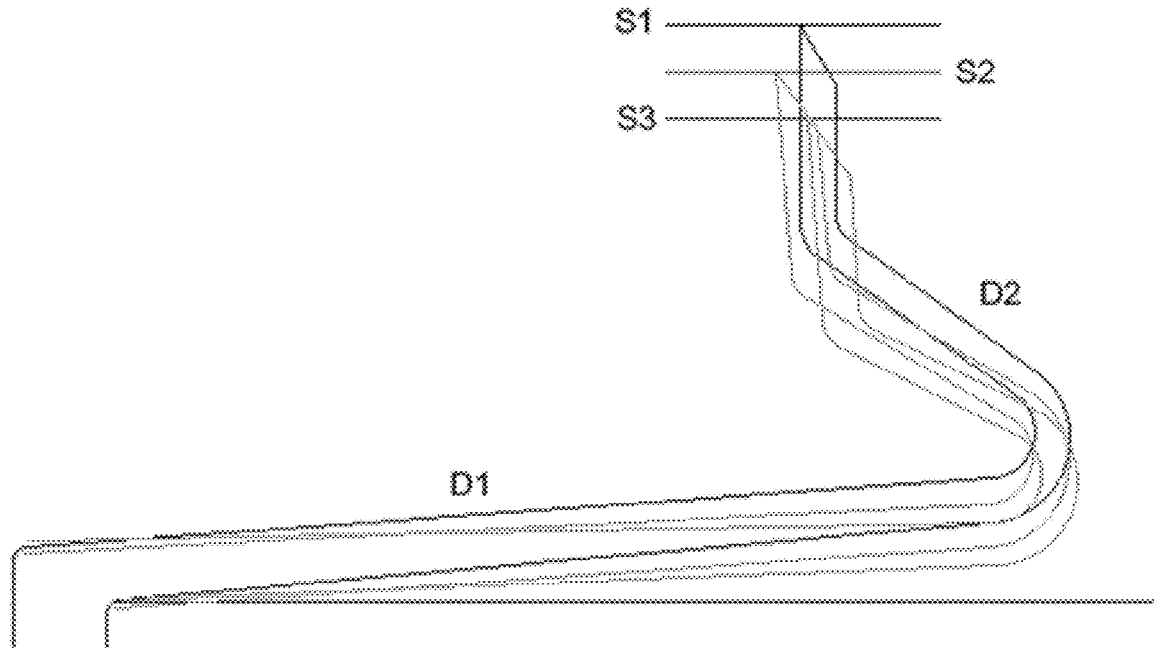
FIG. 3 is a schematic diagram of a sliding process of the needle tip when the contact force D2 generated by the first elastic pin and the counteracting pin is greater than D1 after the needle tip is subjected to pressing force in one embodiment of the present disclosure.

As a preferred embodiment, based on FIG. 3, after the needle tip 6 is subjected to pressing force, the contact force generated by the first elastic pin 2 and the counteracting pin 51 is respectively set to be D1 and D2, and D2<D1. Since the lower contact force will initially drive the movement of the needle tip 6, D2 will first cause the needle tip 6 to slide from position S1 to S2, and then D1 will drive the needle tip 6 to slide from position S2 to position S3, this reduces the sliding distance of the needle tip on the chip. In this case, the scratches on the needle tip 6 will tend to be on the left side in FIG. 5.

Figure 4:
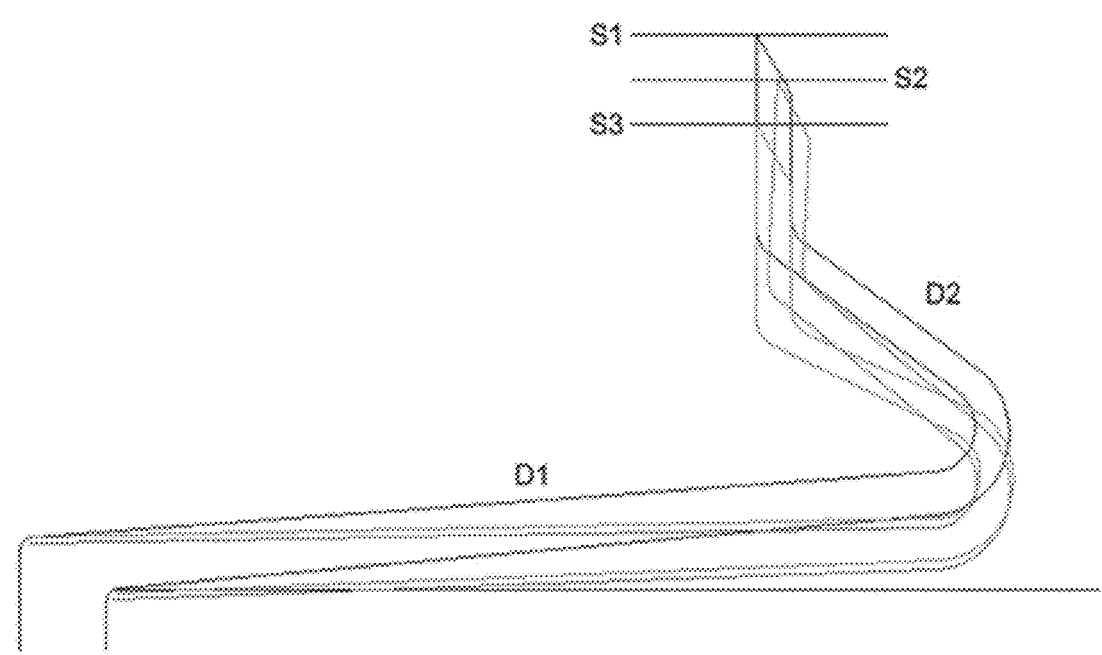
FIG. 4 is a schematic diagram of the sliding process of the needle tip when the contact force D2 generated by the first elastic pin and the counteracting pin is smaller than D1 after the needle tip is subjected to pressing force in one embodiment of the present disclosure.

As a preferred embodiment, based on FIG. 4, after the needle tip 6 is subjected to pressing force, the contact force generated by the first elastic pin 2 and the counteracting pin 51 is respectively set to be D 1 and D 2, and D 2 is greater than D1. Since the lower contact force will initially drive the movement of the needle tip 6, D1 will first cause the needle tip 6 to slide from position S1 to S2, and then D2 will drive the needle tip 6 to slide from position S2 to position S3, this reduces the sliding distance of the needle tip on the chip. In this case, the scratches on the needle tip 6 will tend to be on the right side in FIG. 5.

Figure 5:
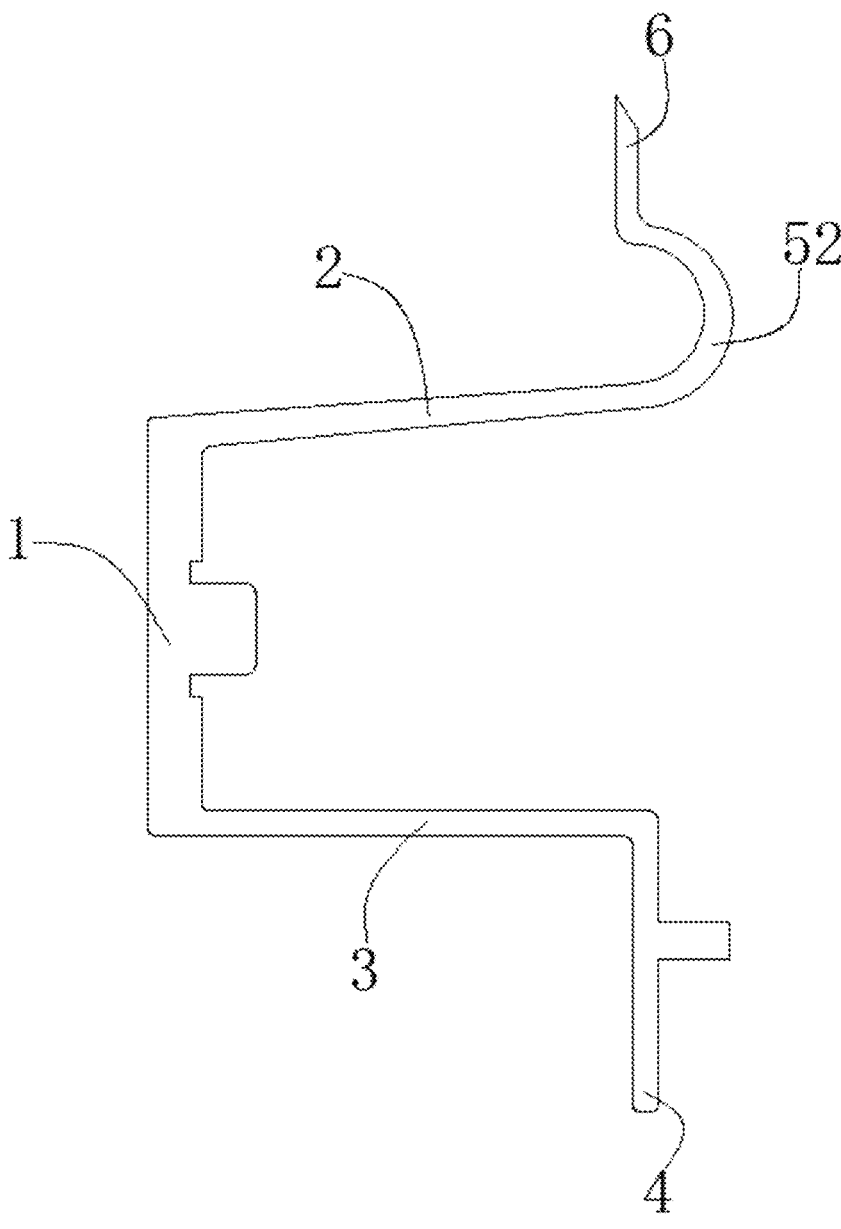
FIG. 5 is a schematic structural diagram of another embodiment of the present disclosure.

As a preferred embodiment, based on FIG. 5, the counteracting pin portion 5 in this embodiment is a circular pin 52 in an arc shape, and an arc opening of the circular pin 52 points to one side of the main body end 1.

Similarly, when the needle tip 6 is subjected to pressing force, the contact force of the first elastic pin 2 drives the needle tip 6 to slide to the right, the circular pin 52 then drives the needle tip 6 to slide to the left, so that the sliding distance of the needle tip 6 on the chip can be reduced, ensuring that no scratches are made on the chip.

Certainly, the structure of the counteracting pin portion 5 in the present test pin structure is not limited to the specific embodiments described above, as long as the structure that can generate or assert an opposite contact force with the first elastic pin 2 is within the scope of protection of this test pin structure.

In conclusion, the exemplary embodiments provided above are intended to illustrate the technical solutions of the present application and are not intended to limit the scope thereof. Although the present disclosure has been described in detail with reference to the foregoing embodiments, it should be understood by those of ordinary skill in the art that: modifications can be made to the technical solutions described in the above embodiments, or certain technical features can be equivalently replaced; and these modifications or substitutions do not make the nature of the corresponding technical solutions separate from the essence and scope of the technical solutions of the embodiments described in this application.

What is claimed is:

1. A test pin structure, comprising:
a main body end, two ends of the main body end respectively extending outwards on the same side to form a first elastic pin and a second elastic pin, wherein the first elastic pin obliquely extends upward from one end of the main body end;
a counteracting pin portion, the other end of the first elastic pin being connected to the counteracting pin portion;
a needle tip vertically disposed at the other end of the counteracting pin portion;
a pin vertically downward disposed at the other end of the second elastic pin;
wherein when the needle tip is subjected to pressing force from the chip, the contact force on the first elastic pin and the counteracting pin portion drives the needle tip to slide in opposite direction, thereby reducing the sliding distance of the needle tip, and then the resulting counter pressure, generated by the contact force on the first elastic pin and the counteracting pin portion allows the needle tip to be inserted into the chip.

2. The test pin structure as claimed in claim 1, wherein the included angle between the first elastic pin and the main body end is between 90° to 125°.

3. The test pin structure as claimed in claim 1, wherein the counteracting pin portion comprises a bending section connected to the first elastic pin, wherein the bending section is bent towards the main body end; the other end of the bending section is connected to a counteracting pin, wherein the other end of the counteracting pin is directed towards the main body end.

4. The test pin structure as claimed in claim 1, wherein the counteracting pin portion is a circular pin, and the arc opening of the circular pin is directed towards one side of the main body end.

5. The test pin structure as claimed in claim 3, wherein the bending angle of the bending section is between 35°~70°.

6. The test pin structure as claimed in claim 1, wherein the reduced sliding distance of the needle tip is 0~0.05 mm in left or right direction.

7. The test pin structure as claimed in claim 3, wherein the contact force generated by the first elastic pin when the needle tip is subjected to pressing force is more or less equal to the contact force generated by the counteracting pin.

8. The test pin structure as claimed in claim 3, wherein the contact force generated by the first elastic pin when the needle tip is subjected to pressing force is smaller than the contact force generated by the counteracting pin.

9. The test pin structure as claimed in claim 3, wherein the contact force generated by the first clastic pin when the needle tip is subjected to pressing force is greater than the contact force generated by the counteracting pin.

* * * * *